United States Patent [19]

Guha et al.

[11] Patent Number: 5,256,576
[45] Date of Patent: Oct. 26, 1993

[54] METHOD OF MAKING PIN JUNCTION SEMICONDUCTOR DEVICE WITH RF DEPOSITED INTRINSIC BUFFER LAYER

[75] Inventors: Subhendu Guha; Chi C. Yang, both of Troy; Arindam Banerjee, Madison Heights, all of Mich.

[73] Assignee: United Solar Systems Corporation, Troy, Mich.

[21] Appl. No.: 836,225

[22] Filed: Feb. 14, 1992

[51] Int. Cl.⁵ .................... H01L 31/18; H01L 31/075
[52] U.S. Cl. ........................... 437/4; 437/101; 136/258; 257/458; 427/74; 427/575; 427/578
[58] Field of Search ..................... 437/2–5, 437/101; 427/508–509, 574–575, 578, 74; 136/258 AM; 357/30 J, 30 K, 59 C, 59 D, 58; 257/458

[56] References Cited

U.S. PATENT DOCUMENTS

| | | | |
|---|---|---|---|
| 4,517,223 | 5/1985 | Ovskinsky et al. | 427/39 |
| 4,619,729 | 10/1986 | Johncock et al. | 156/606 |
| 5,034,333 | 7/1991 | Kim | 437/4 |

FOREIGN PATENT DOCUMENTS 62-131513  6/1987  Japan ..................... 136/258 AM Primary Examiner—Aaron Weisstuch
Attorney, Agent, or Firm—Krass & Young

[57] ABSTRACT

A method for manufacturing thin film, photovoltaic devices of the type having an intrinsic semiconductor layer disposed between two oppositely charged doped, semiconductor layers. A buffer layer of intrinsic semiconductor material is RF deposited at the junction between a microwave deposited, base intrinsic layer and a layer of doped material. The cell produced by the method of the present invention has enhanced performance characteristics over cells having microwave deposited intrinsic layers with no barrier layers.

12 Claims, 2 Drawing Sheets

METHOD OF MAKING PIN JUNCTION SEMICONDUCTOR DEVICE WITH RF DEPOSITED INTRINSIC BUFFER LAYER

FIELD OF THE INVENTION

This invention relates generally to semiconductor devices and more particularly to a plasma deposition process for their manufacture. In particular, the invention relates to a plasma deposition process in which a buffer layer of intrinsic semiconductor material is radio frequency deposited at the junction between a microwave deposited, intrinsic base layer and a doped layer of the device.

BACKGROUND OF THE INVENTION

Photovoltaic devices provide clean, quiet and reliable sources of electrical power. Because of shortages and environmental problems associated with fossil and nuclear fuels, as well as recent advances in technology which have significantly decreased the cost and increased the efficiencies of photovoltaic devices, solar generated electrical power is of growing commercial importance. The earliest photovoltaic devices were manufactured from single crystalline material. These devices were expensive, delicate, relatively bulky, and difficult to manufacture in large area configurations. Various techniques have now been developed for preparing thin film semiconductor materials which manifest electrical properties equivalent and in many instances superior, to their crystalline counterparts. These thin film materials may be readily deposited over very large areas and on a variety of substrates. Such alloys and techniques for their preparation are disclosed, for example, in U.S. Pat. Nos. 4,226,898 and 4,217,374. One important class of photovoltaic devices comprises a layer of intrinsic semiconductor material interposed between two oppositely doped semiconductor layers. Such devices are termed P-I-N or N-I-P devices depending on the order of the layers; the two terms shall be used interchangeably herein.

Glow discharge deposition comprises one particularly important class of techniques for the preparation of thin film semiconductor materials. In a glow discharge method, a process gas, typically at subatmospheric pressures, is energized by an electrical field so as to produce a plasma comprised of ionized and/or otherwise activated species derived from the process gas. The plasma acts to produce a semiconductor deposit on a substrate maintained in proximity thereto. Initially, such glow discharge deposition processes were energized by direct current, or, more commonly, by alternating current in the radio frequency range. While such techniques produce high quality, thin film semiconductor materials, deposition rates obtained thereby are quite low, and significant amounts of process gas are wasted. Attempts to raise the deposition rate, either by increasing the gas pressure or by greatly increasing the power density, result in the production of polymeric and oligomeric species which contaminate and degrade the semiconductor layers.

It has been found that microwave energy may be beneficially employed to energize a plasma in a glow discharge deposition process, and that a microwave energized plasma process is particularly advantageous for semiconductor fabrication. Very high rates of deposition may be achieved which are concomitant with a greatly enhanced process gas utilization. The application of microwave energy to glow discharge semiconductor deposition is disclosed, for example, in U.S. Pat. Nos. 4,517,223 and 4,619,729.

While microwave energized processes are attractive because of their high deposition rates and high rates of gas utilization, it has been found that the semiconductor materials deposited by these processes are generally of somewhat lower quality than those materials derived from an RF or DC energized plasma. Photovoltaic devices which include microwave deposited semiconductor layers have an overall efficiency which is generally lower than that of corresponding RF prepared devices. This is thought to be due to the fact that the higher energy microwaves create highly energized species, such as hydrogen ions. Energized hydrogen ions are necessarily present in any plasma derived from silane and other silicon hydrides ($Si_xH_y$) and these hydrogen ions can etch or otherwise interact with the surface of the deposited layer as it is being deposited. In the case of the more energetic hydrogen ions created by microwave-energized processes, it is speculated that the highly energetic hydrogen ions can actually do significant damage to the surface of the layer of deposited material. Additionally, the highly energized species produced by microwave deposition processes tend to deposit a semiconductor having a high density of states in the gap, a highly undesirable result.

It has been found that the interface between an intrinsic and a doped layer in semiconductor devices such as photovoltaic devices is particularly sensitive to deposition conditions. If a photovoltaic device of the P-I-N type is fabricated to have a doped-intrinsic layer interface wherein one of the layers is deposited in a microwave process and the other is deposited in a radio-frequency process, efficiency of the device will be degraded. Hence, it will be seen that a degraded interface between a doped semiconductor thin layer and an intrinsic semiconductor layer can result from microwave deposition of the intrinsic layer; and a degraded interface results in inferior performance of the entire device.

Clearly, it would be desirable to make thin film semiconductor devices employing a plasma deposition process which has the advantages of speed and efficiency characteristic of microwave deposition, and which also achieves devices which have the enhanced performance characteristics resulting from radio frequency deposition techniques. It would be particularly advantageous if such devices could be produced efficiently in a roll to roll process.

SUMMARY OF THE INVENTION

There is disclosed herein a method of making an improved semiconductor device of the type having a junction between a layer of intrinsic semiconductor material and a layer of doped semiconductor material. The method includes the steps of: providing a deposition chamber; disposing a substrate in the chamber; introducing an intrinsic semiconductor precursor gas into the chamber; energizing the precursor gas with microwave energy to form a plasma which decomposes the gas and deposits a base layer of intrinsic semiconductor material on the substrate; energizing the precursor gas with radio frequency energy to form a plasma which decomposes the gas and deposits a buffer layer of intrinsic semiconductor material onto the base layer; and depositing a layer of doped semiconductor material onto the buffer layer of intrinsic semiconductor material. The doped layer may be deposited atop the buffer layer by a variety of techniques, including RF microwave or DC plasma techniques, evaporation or any other such method.

In particular embodiments, the semiconductor precursor gas includes a group 4A elements such as silicon or germanium therein, and the doped semiconductor material includes a group 3A or 5A element. However, the method may be advantageous when employed with any semiconductor material.

The method is particularly suited for manufacturing photovoltaic devices of the type having a body of intrinsic semiconductor material between oppositely doped layers of semiconductor material. First and second buffer layers may be deposited at the junctions between the intrinsic base layer and both, oppositely doped layers.

In a particular embodiment, the method includes the further step of providing a separate deposition chamber for microwave deposition of the intrinsic base layer and for the RF deposition of the buffer layer or layers. In most instances, the P and N doped layers will also be RF deposited; separate regions in the RF deposition chamber may be provided for depositing the N-doped layer, the intrinsic buffer layer or layers, and the P-doped layer. RF deposition is typically carried out at higher pressures than microwave deposition so the provision of separate chambers for the two processes eliminates the necessity of pumping a single chamber up or down to change the pressure as required by the different deposition processes being used. However, the method of the present invention could also be performed in a single deposition chamber.

Alternatively, separate deposition chambers for each microwave deposited layer and each rf deposited layer could be provided. That is, the process of the present invention may employ a separate rf deposition chamber for the doped layer, a separate rf deposition chamber for the first buffer layer, a separate microwave chamber for the intrinsic base layer, a separate rf chamber for a second buffer layer, and a separate rf chamber for a p-doped layer. The various chambers may be disposed linearly along a production line, with the substrate provided in a roll-to-roll form, as is well known in the prior art. Each chamber is isolated by the use of prior art gas gates, both to prevent contamination, and so that pressure appropriate for each deposition chamber may be continuously maintained.

BRIEF DESCRIPTION OF THE DRAWINGS

The following detailed description is best understood by reference to the following drawings, in which.

DETAILED DESCRIPTION OF THE INVENTION

Figure 1:
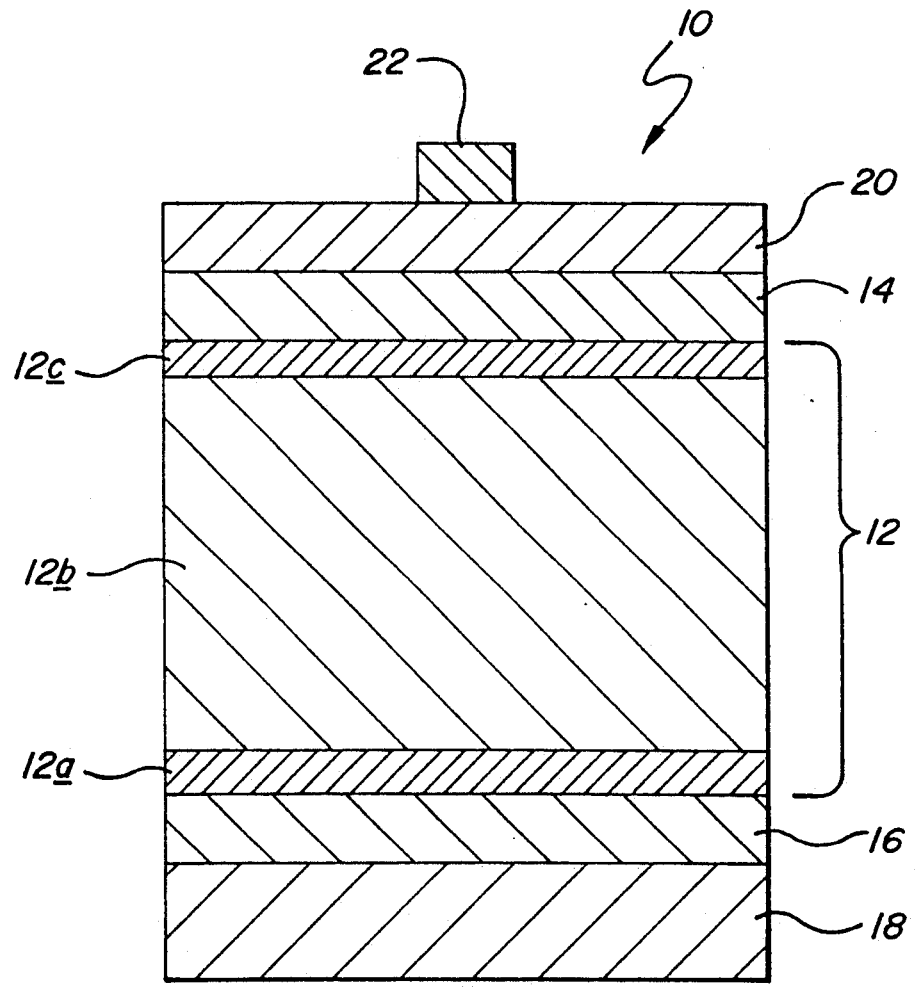
FIG. 1 is a cross-sectional view of a photovoltaic device structured in accord with the principles of the present invention.

Referring now to FIG. 1, there is shown a cross-sectional view of a photovoltaic device 10 structured in accord with the principles of the present invention. The device 10 comprises a body of substantially intrinsic, thin film silicon alloy material 12 interposed between a layer of P-doped silicon alloy material 14 and a layer of N-doped silicon alloy material 16. This structure is typical of P-I-N-type photovoltaic devices well known in the prior art. The silicon alloy material may comprise an amorphous, crystalline, or polycrystalline alloy material and may include alloying elements such as hydrogen, halogens, germanium, carbon, nitrogen, and the like. In the most preferred embodiment, the layer of P-doped semiconductor material 14 is a microcrystalline layer manifesting high electrical conductivity and high transparency.

The photovoltaic device 10 further includes a substrate 18 which is electrically conductive and which functions as a bottom electrode of the device. The substrate 18 may comprise a body of metal such as stainless steel and the like or an insulating material such as glass, ceramic, or a polymer having an electrically conductive coating thereupon. In particular embodiments, the substrate 18 may include a highly reflective layer fabricated of silver or the like, and may be texturized to increase light scattering therefrom. The photovoltaic device 10 of FIG. 1 further includes a top electrode layer 20, preferably fabricated from a transparent conductive metal oxide (TCO), such as indium oxide, tin oxide, and combinations thereof. In particular embodiments, the photovoltaic device further includes a current-collecting grid structure 22 associated with the TCO layer 20 to facilitate an efficient collection of photo-generated current.

It is to be understood that the device 10 of FIG. 1 is merely representative of a typical photovoltaic device, and in actual configuration, may comprise an array of vertically stacked P-I-N-photovoltaic devices. Also, the device referred to herein as a P-I-N-type photovoltaic device may be manufactured in an inverted condition, i.e., with the N layer 16 proximate the TCO electrode 20. Within the context of this disclosure, both structures are equivalent, and the principles of the present invention may be applied to both.

In accord with the present invention, the intrinsic layer 12 includes a buffer layer 12a disposed proximate the interface of the intrinsic 12/N doped layer 16. The buffer layer 12a is distinguished from the bulk 12b of the intrinsic layer by the fact that it is deposited by radio frequency energized plasma, rather than by the microwave-energized plasma deposition process used to deposit the bulk 12b. Optionally, a second buffer layer 12c may be disposed proximate the interface of the intrinsic 12/p-doped layer 14. If present, the second buffer layer 12c, like buffer 12a, is deposited from radio frequency energized plasma.

In the FIG. 1 embodiment, the buffer layer 12a (adjacent the N-doped layer 16) is approximately 180 Angstroms thick. The buffer layer 12c (adjacent the P-doped layer 14) is approximately 60 Angstroms thick. It is to be noted that both of these rf deposited buffer layers are much thinner than the microwave deposited intrinsic base layer 12, which, typically, is 1000-3000 Angstroms thick. Generally, it has been found that buffer layers having thicknesses in these ranges are generally preferable in order to achieve the dual objectives of microwave deposition efficiency and RF deposition quality. In other words, if the buffer layers are too thin then they no longer serve their function of protecting the integrity of the surrounding layers. On the other hand, if the buffer layers are too thick in proportion to the remainder of the intrinsic layer, the advantages of the microwave process will not be achieved because too much time and process gas will be spent in depositing them.

Figure 2:
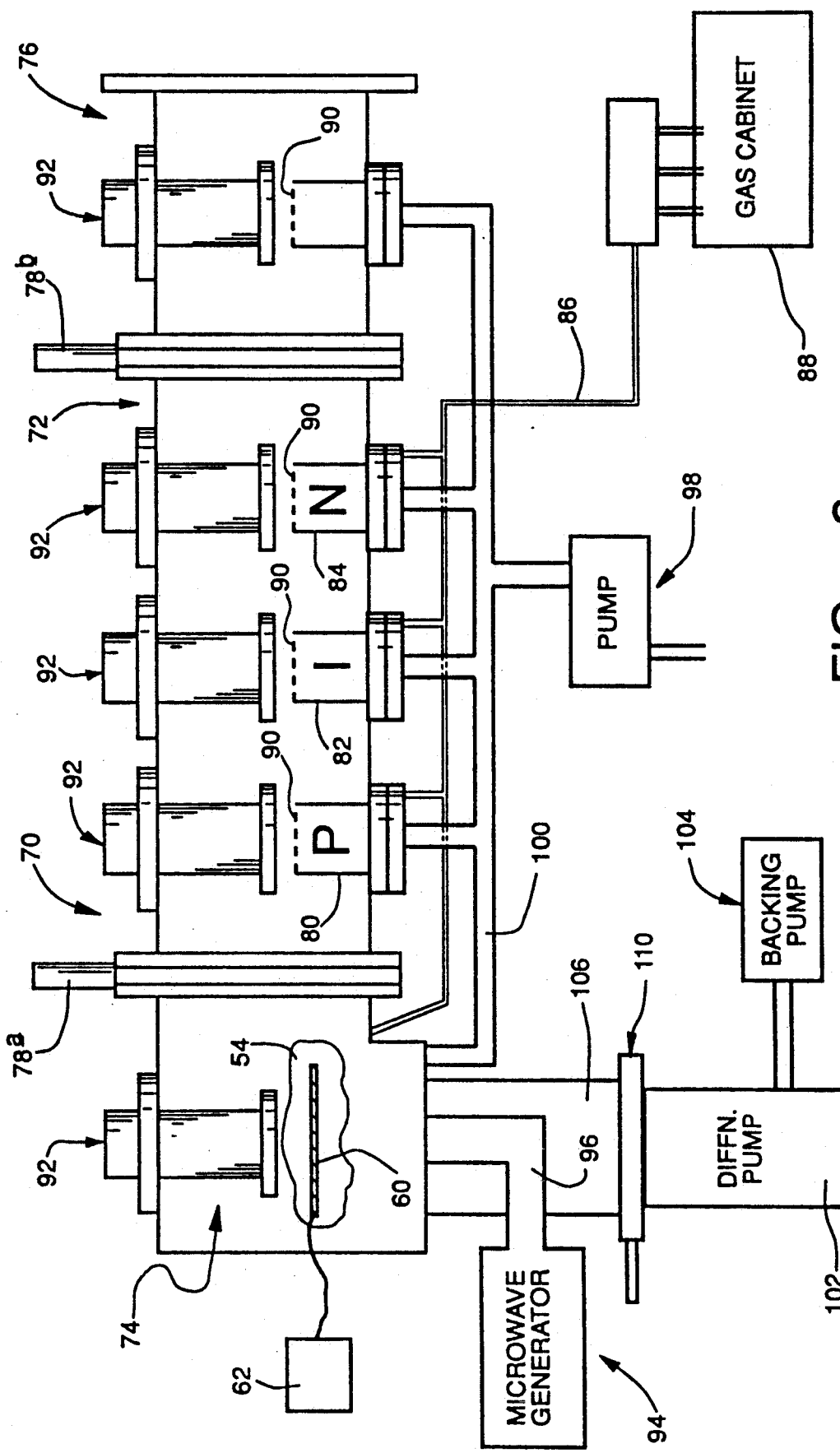
FIG. 2 is a schematic depiction of an RF/microwave energized deposition apparatus for the preparation of N-I-P type photovoltaic devices.

FIG. 2 depicts a plasma deposition apparatus 70 suitable for use in the practice of the present invention. The apparatus 70 shown in FIG. 2 is operative to deposit a plurality of semiconductor layers upon a substrate. The apparatus 70 is notable insofar as it includes a radio frequency energized deposition chamber 72, as well as a microwave energized deposition chamber 74. In this manner, the apparatus 70 may be used for preparation of semiconductor devices under a variety of conditions. The apparatus 70 further includes a loading chamber 76 for removal and replacement of substrates. Separating the RF chamber 72, microwave chamber 74, and loading chamber 76 are gate valves 78a,78b; as is well known to those of skill in the art, such valves may be readily opened and closed to allow passage of a fairly large substrate between adjoining chambers of the apparatus 70.

The RF chamber 72 includes three separate deposition regions 80, 82, and 84, which are adapted to deposit P-type, intrinsic, and N-type semiconductor layers, respectively. Toward that end, each deposition region is provided with a gas supply via a manifolded conduit 86 communicating with a gas supply cabinet 88. Each RF deposition region 80,82,84 includes a cathode 90 which is energized by radio frequency energy via a power supply (not shown). Each RF deposition region 80,82.84 further includes a substrate holder and heater assembly 92 which retains and heats a deposition substrate. It will be noted that the loading chamber 76 also includes a substrate heater assembly 92 and further includes a cathode 90. The heater 92 and cathode 90 associated with the loading chamber 76 may be employed to pretreat the substrate as, for example, by plasma cleaning, deposition of other particular layers, and the like, as is well known in the art.

The microwave chamber 74 also includes a substrate heater assembly 92, but it will be noted that this chamber 74 includes no cathode assembly. Instead, the microwave chamber 74 is supplied with microwave energy via a microwave generator 94 operatively communicating therewith by a waveguide 96 in a manner well known in the prior art.

The apparatus 70 further includes a process pump 98 operatively communicating with the various chambers via a vacuum conduit 100. It will also be noted that the microwave chamber 74 includes a separate pumping system comprised of a diffusion pump 102 having a backup pump 104 associated therewith and operatively connected to the microwave chamber 74 by a conduit 106 and a gate valve 110. The microwave deposition process typically employs a very high flow rate of process gas and operates in a pressure regime different from the RF energized deposition and, hence, the separate pumping system is typically employed to maintain the proper pressure under these dynamic conditions. As is known in the art, the microwave chamber 72 may also include a bias wire 60 disposed in the plasma region 54. This wire 60 is in electrical communication with a bias power supply 62. By appropriately controlling bias during the deposition, typically to a value of positive 20 volts, quality of the semiconductor layer is improved.

The apparatus 70 may be employed to manufacture a variety of configurations of semiconductor devices. In a typical process, a substrate is placed into the loading chamber 76; the pressure therein is lowered, and any pretreatment, such as plasma cleaning, is carried out. The gate valve 78b is then opened, and the substrate transferred by a conveyor system (not shown) to either the RF or microwave deposition chambers. By employing the appropriate deposition stations in the RF chamber 72, various doped or intrinsic base layers may be placed on the substrate. By opening the gate valve 78a and conveying the substrate into the microwave deposition chamber 74, the deposition of semiconductor layers by microwave energy may be carried out.

EXAMPLE 1

A P-I-N type photovoltaic device was prepared in accord with prior art techniques. A stainless steel substrate was placed in the N region of the R.F. deposition chamber of an apparatus generally similar to that of FIG. 2. The apparatus was sealed and an atmosphere comprising 20 sccm of hydrogen, 0.75 sccm of a 1% mixture of phosphine in hydrogen, and 0.65 sccm of disilane was flowed therethrough. The pump was adjusted to maintain a pressure of 1.2 torr in the chamber. The substrate heater was energized to maintain the substrate at a temperature of approximately 350° C. The gas mixture was energized with radio frequency energy of 13.56 MHz. The cathode was approximately 3.5 inches in diameter and a power of 2 watts was applied thereto. The deposition conditions were maintained until approximately 200 angstroms of N-doped silicon alloy material was deposited on the substrate, at which time cathode power was terminated.

The substrate, bearing the N-layer, was transferred to the microwave chamber and the gas gate thereto closed to seal the chamber from the remainder of the apparatus. An atmosphere of 30 sccm of silane, 16 sccm of $GeH_4$ and 30 sccm pf helium was flowed through the chamber. The pump was adjusted to maintain a pressure of 15 millitorr in the chamber and the substrate was heated to 350° centigrade. Microwave energy of approximately 950 watts at 2.45 GHz was introduced into the chamber. A bias of +20 volts was maintained on the bias wire 60. The input of microwaves was maintained for 30 seconds and a layer of intrinsic semiconductor material of approximately 1,000–3,000 angstroms thickness was deposited.

After completion of the deposition of the intrinsic layer, the gate valve 78a was again opened and the coated substrate conveyed to the P region 80 of the R.F. deposition chamber 72. The chamber was sealed and an atmosphere of 95 sccm hydrogen, 3.25 sccm of a 2% mixture of $BF_3$ in hydrogen and 2.5 sccm of a 5% mixture of silane in hydrogen was flowed through the chamber. The pump was adjusted to maintain a pressure of 1.7 torr in the chamber and the substrate heater energized to maintain the substrate at a temperature of 175° C. The cathode was approximately 2.7 inches in diameter and was energized with 30 watts of radio frequency energy at 13.56 MHz. These conditions provided for the deposition of a microcrystalline layer of p-doped silicon alloy material. The deposition was carried out for a sufficient length of time to deposit a 100 angstroms thick layer onto the intrinsic layer, at which time the radio frequency energy was terminated and the system purged with argon. The thus completed photovoltaic device was removed form the apparatus and provided with a top electrode of a TCO material in a conventional vacuum evaporation process. The top electrode was approximately 650 angstroms thick.

The completed device was then tested by measuring its current/voltage characteristics under the illumination of an AM-1.5 solar spectrum. It had an open circuit voltage of 0.67 V and a short circuit current of approximately 17.8 MA/cm². The efficiency was 6.7%, with a fill factor of 0.57.

EXAMPLE 2

A second photovoltaic device was prepared as per Example 1 except that rf deposited buffer layers were deposited at the intrinsic/doped layer interfaces. The substrate bearing the N layer was transferred to the intrinsic region 82 of the RF chamber 72. An atmosphere of 20 sccm hydrogen and 65 sccm of disilane was flowed through the chamber 72. The pump 98 was adjusted to maintain a pressure within the chamber 72 of approximately 1.2 torr and the substrate heater 92 associated with the intrinsic region 82 was energized to maintain the substrate at a temperature of 350° C. The cathode 90 associated with intrinsic region 82 was approximately 3.5 inches in diameter, and was energized with 2 watts of radio frequency at 13.56 MHz. These conditions provided for the deposition of a buffer layer of intrinsic silicon alloy material. The deposition was carried out for a sufficient length of time to deposit an 180 angstroms thick layer onto the N-doped layer, at which time cathode power was terminated.

The apparatus 70 was employed to RF deposit a second buffer layer atop the microwave deposited intrinsic layer. In this case, the substrate, after leaving the microwave chamber 74, was again conveyed to the intrinsic region 82 of the RF chamber 72. The process parameters for deposition of the second buffer layer were similar to those described above for the first buffer layer and will not be repeated here. However, the second buffer layer was only 60 angstroms thick, about one third the thickness of the first buffer layer. After RF deposition of the second buffer layer, the substrate was then conveyed to the P region 80 of RF chamber 72 for RF deposition of the P-layer.

When this device was tested, it showed an open circuit voltage of 0.73 V (in contrast to 0.67 V for the device of Example 1). The short circuit current was 18.6 mA/cm² (compared to 17.8 mA/cm²). The fill factor was 0.56 (virtually unchanged), and the cell efficiency was 7.66%, a significant improvement over the prior art device. (6.7%)

By employing the process of the present invention, photovoltaic devices may be efficiently fabricated through the use of rapid, efficient microwave deposition of the intrinsic layer, without any need to compromise cell performance. Cell efficiency is significantly better than for prior art devices. Thus, the dual objectives of deposition process efficiency and enhanced device performance are achieved.

It is to be understood that the present invention, although primarily described with reference to the manufacture of photovoltaic devices of P-I-N-type configuration in a mixed RF/microwave process, may also be practiced with regard to all other semiconductor devices including a semiconductor junction between a microwave deposited intrinsic layer and a doped layer. Specifically, the invention may be practiced with regard to photovoltaic devices of other configurations, other semiconductor devices, such as diodes, electrophotographic receptors, and the like. Furthermore, while the examples described herein include semiconductor alloy materials comprised of silicon, germanium and hydrogen, the invention is not limited to such materials but may be used with any suitable semiconductor material. In view of the foregoing, it will be appreciated that the drawings, discussion and descriptions herein are merely illustrative of particular embodiments of the present invention, and are not meant to be limitations upon the practice thereof. It is the following claims, including all equivalents thereof, which define the scope of the invention.

We claim:

1. A method of making an improved semiconductor device of the type having a junction between a layer of intrinsic semiconductor material and a layer of doped semiconductor material, said method including the steps of:

providing a deposition apparatus;

disposing a substrate in said apparatus;

introducing a first intrinsic semiconductor precursor gas into the apparatus for depositing an intrinsic semiconductor material having a first band gap;

introducing microwave energy into the apparatus, said energy operative to form a first plasma form, and decompose, said intrinsic semiconductor precursor gas so as to deposit a base layer of intrinsic semiconductor material of a first band gap on the substrate;

introducing a second intrinsic semiconductor precursor gas into the apparatus for depositing an intrinsic semiconductor material having a second band gap which is greater than said first band gap;

introducing radio frequency energy into the apparatus, said radio frequency energy operative to form a second plasma from, and decompose, said second intrinsic semiconductor precursor gas so as to deposit a first buffer layer of intrinsic semiconductor material on the base layer, said first buffer layer having a band gap which is greater than the band gap of said base layer; and depositing a layer of doped semiconductor material on said first buffer layer of intrinsic semiconductor material.

2. The method of claim 1 wherein the step of introducing a first intrinsic semiconductor precursor gas into the apparatus comprises introducing a gas including a Group 4A element therein.

3. The method of claim 1 wherein the step of introducing a first intrinsic semiconductor precursor gas into the apparatus comprises introducing a gas including a member selected from the group consisting of: $SiF_4$; $SiH_4$; $Si_2H_6$; $GeH_4$; $GeF_4$; and combinations thereof.

4. The method of claim 1 including the further step of maintaining said first intrinsic semiconductor precursor gas at a pressure of less than 0.1 torr while the microwave energy forms the plasma from said gas.

5. The method of claim 1 including the further step of maintaining the substrate at an elevated temperature.

6. The method of claim 1 wherein the step of disposing a substrate in the deposition apparatus comprises disposing a substrate having a doped semiconductor base layer of a first conductivity type thereon in said apparatus, and the method comprises the further step of introducing said second intrinsic semiconductor precursor gas and radio frequency to deposit a second buffer layer of intrinsic semiconductor material having a band gap which is greater than the band gap of said base layer, on said doped semiconductor layer of said first conductivity type.

7. The method of claim 6 wherein the step of depositing a layer of doped semiconductor material on said first buffer layer of intrinsic semiconductor material comprises depositing a doped layer of a second conductivity type which is opposite said first conductivity type.

8. The method of claim 1 wherein the step of providing a deposition apparatus comprises the further step of providing an apparatus having separate microwave and radio frequency deposition chambers for, respectively, deposition of said intrinsic base layer and said first buffer layer.

9. A method of making an improved photovoltaic device of the type comprising a layer of intrinsic semiconductor material disposed between oppositely doped layers of semiconductor material, said method including the steps of:

providing a first radio frequency deposition chamber, said chamber having a plasma region defined therein;

providing a second, microwave deposition chamber;

placing a substrate having a first, doped semiconductor layer of a first conductivity type disposed upon at least a portion thereof in said first chamber;

disposing a source of radio frequency energy so as to introduce radio frequency energy into the plasma region of the first deposition chamber;

introducing a first intrinsic semiconductor precursor gas into said first chamber for depositing a first intrinsic semiconductor material having a first band gap;

introducing radio frequency energy into said first chamber so as to energy said first intrinsic semiconductor precursor gas to create a plasma therefrom which decomposes said first intrinsic precursor gas and deposits a first buffer layer of said first intrinsic semiconductor material onto said first doped semiconductor layer;

positioning said substrate in said second chamber;

disposing a source of microwave energy so as to introduce microwave energy into the second deposition chamber;

introducing a second intrinsic semiconductor precursor gas into said second chamber for depositing a second intrinsic semiconductor material having a second band gap which is less than said first band gap;

introducing microwave energy into said second chamber so as to energize said second intrinsic semiconductor precursor gas so as to create a plasma therefrom which decomposes said second intrinsic precursor gas and deposits a base layer of said second intrinsic semiconductor material onto said first buffer layer of intrinsic semiconductor material;

positioning said substrate in said first chamber;

introducing radio frequency energy into said first chamber so as to energize said first intrinsic semiconductor precursor gas so as to create a plasma therefrom which decomposes said first intrinsic precursor gas and deposits a second buffer layer of said first intrinsic semiconductor material onto said base intrinsic semiconductor layer; and depositing a second doped semiconductor layer atop said second buffer layer, said second doped semiconductor layer being of opposite conductivity type to said first doped semiconductor layer.

10. The method of claim 9 wherein the step of introducing said first intrinsic, semiconductor precursor gas comprises introducing a silicon-containing gas.

11. The method of claim 9 wherein the step of disposing a substrate having a first, doped, semiconductor layer comprises disposing a substrate having a semiconductor layer including a Group 5A and a Group 4A element thereon and the step of depositing a second, doped, semiconductor layer comprises depositing a semiconductor layer including a Group 3A and a Group 4A element therein.

12. The method of claim 9 wherein the step of disposing a substrate having a first, doped, semiconductor layer comprises disposing a substrate having a semiconductor layer including a Group 3A and a Group 4A element therein and the step of depositing a second, doped, semiconductor layer comprises depositing a semiconductor layer including a Group 5A and a Group 4A element therein.

* * * * *